US008724318B2

(12) United States Patent
Liang et al.

(10) Patent No.: US 8,724,318 B2
(45) Date of Patent: May 13, 2014

(54) PORTABLE ELECTRONIC APPARATUS AND CASING THEREFOR

(75) Inventors: Chen-Yi Liang, New Taipei (TW); Hung-Chih Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 187 days.

(21) Appl. No.: 13/241,166

(22) Filed: Sep. 22, 2011

(65) Prior Publication Data

US 2012/0327611 A1 Dec. 27, 2012

(30) Foreign Application Priority Data

Jun. 21, 2011 (TW) .............................. 100121604 A

(51) Int. Cl.
*G06F 1/16* (2006.01)
*H05K 5/02* (2006.01)

(52) U.S. Cl.
CPC ................ *G06F 1/16* (2013.01); *H05K 5/0221* (2013.01); *G06F 1/1601* (2013.01); *G06F 1/1679* (2013.01)
USPC ................................. 361/679.58; 361/679.02

(58) Field of Classification Search
CPC ....... G06F 1/16; G06F 1/1601; G06F 1/1679; G06F 1/181; G06F 13/409; H05K 7/14; H05K 5/0217; H05K 5/0221
USPC ............. 361/679.02, 679.08, 679.11, 679.55, 361/679.58; 174/50; 220/326, 281–283
See application file for complete search history.

(56) References Cited

U.S. PATENT DOCUMENTS

| 5,415,955 | A | * | 5/1995 | Kobayashi et al. | ............. 429/97 |
| 5,535,437 | A | * | 7/1996 | Karl et al. | .................. 455/575.1 |
| 5,574,477 | A | * | 11/1996 | Shimizu et al. | ................ 345/102 |
| 5,848,719 | A | * | 12/1998 | Goldenberg | ................... 220/326 |
| 8,252,444 | B2 | * | 8/2012 | Liang | ............... 429/97 |
| 8,322,801 | B2 | * | 12/2012 | Yang et al. | .................. 312/223.2 |
| 2007/0048599 | A1 | * | 3/2007 | Choi | ................. 429/97 |

OTHER PUBLICATIONS

Office action mailed on Nov. 19, 2013 for the Taiwan application No. 100121604, filing date: Jun. 21, 2011, p. 1 line 13-14, p. 2-5, p. 6 line 1-10 and search report.

* cited by examiner

Primary Examiner — Bernard Rojas
(74) Attorney, Agent, or Firm — Winston Hsu; Scott Margo

(57) ABSTRACT

A portable electronic apparatus and a casing thereof are disclosed. The portable electronic apparatus includes the casing including a base and an upper cover, and an electronic processing module disposed in the base. The base includes a first engagement structure having a lock slot. The upper cover includes a plate member and a second engagement structure mounted on the plate member. The second engagement structure includes a locking part and a detaching part connected to the locking part. The base and the upper cover are engaged such that the locking part is locked in the lock slot. The detaching part can be moved so as to detach the locking part from the lock slot. Therefore, a user can detach the locking part from the lock slot by the detaching part without any tools, which greatly reduces the complexity of the detachment of a casing of a conventional portable electronic apparatus.

10 Claims, 11 Drawing Sheets

PORTABLE ELECTRONIC APPARATUS AND CASING THEREFOR

BACKGROUND OF THE INVENTION

1. Field of the Invention

The invention relates to a portable electronic apparatus, and especially relates to a portable electronic apparatus whose casing is capable of being disassembled easily and quickly.

2. Description of the Prior Art

A casing of a conventional electronic apparatuses is usually assembled by screws with auxiliary hooks for fixing, even by other more complicated engagement mechanisms, so the casing needs tools to be disassembled. It is time waste. If the casing is not often disassembled, it may be tolerable. Nevertheless, if the casing needs to be disassembled frequently, it is not only time waste but also inconvenient. Take a decoration cover for the host of a notebook computer as an example; the main purpose therefor is for decoration. So the decoration cover is designed to be changeable by request of a user. The decoration cover needs to be convenient for the change by the user; on the contrary, the engagement of the decoration cover with the host needs to be firm lest the decoration cover should come off from the host. However, the current engagement mechanisms for casing cannot satisfy both the convenience and the fixity of the engagement for the casing.

SUMMARY OF THE INVENTION

An objective of the invention is to provide a casing for portable electronic apparatus. The engagement structure of the casing includes a detaching part, which a user can manipulate to disassemble the casing.

The casing of the invention includes a first casing member and a second casing member. The first casing member includes a first engagement structure. The first engagement structure has a lock slot. The second casing member includes a plate member and a second engagement structure. The second engagement structure is fixed on the plate member and includes a locking part and a detaching part connected to the locking part. The second casing member is engaged with the first casing member such that the locking part is locked in the lock slot. Therein, the detaching part is capable of being moved so as to detach the locking part from the lock slot. Therefore, a user can directly move the detaching part to drive the locking part to depart from the lock slot, so as to detach the second casing member from the first casing member. Further, if other engagement structure of the second casing member with the first casing member is designed of hooks correspondingly, the user can directly detach the second casing member from the first casing member without any other tools after the locking part has been disengaged from the lock slot.

Another objective of the invention is to provide a portable electronic apparatus, having the casing of the invention. Similarly, a user can directly manipulate the detaching part to disassemble the casing.

The portable electronic apparatus of the invention includes a base, an electronic processing module, and an upper cover. The base includes a first engagement structure. The first engagement structure has a lock slot. The electronic processing module is disposed in the base. The upper cover includes a plate member and a second engagement structure. The second engagement structure is fixed on the plate member and includes a locking part and a detaching part connected to the locking part. The upper cover is engaged with the base such that the locking part is locked in the lock slot. Therein, the detaching part is capable of being moved so as to detach the locking part from the lock slot. Similarly, the user can directly move the detaching part to drive the locking part to depart from the lock slot, so as to detach the upper cover from the base.

Therefore, the invention uses the locking part and the lock slot of the portable electronic apparatus and the casing thereof to provide stable engagement and uses the detaching part connected to the locking part for a user to directly manipulate the detaching part to make the locking part depart, which satisfies both the fixity of the casing engagement and the convenience of the casing detachment and solves the complicated detachment procedure and the difficulty in satisfying both the convenience and the fixity of the engagement for the casing in the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
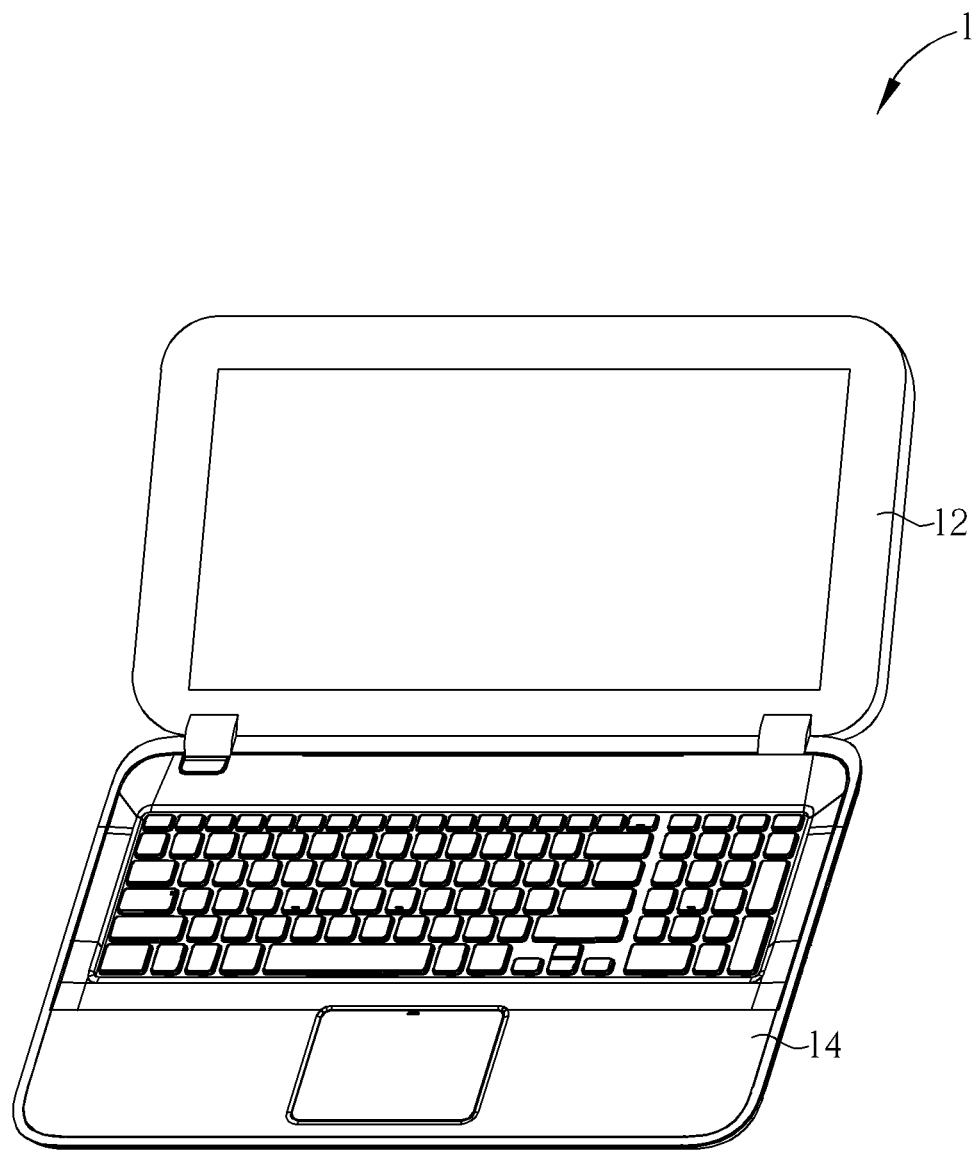
FIG. 1 is a schematic diagram illustrating a portable electronic apparatus of an embodiment according to the invention.
Figure 2:
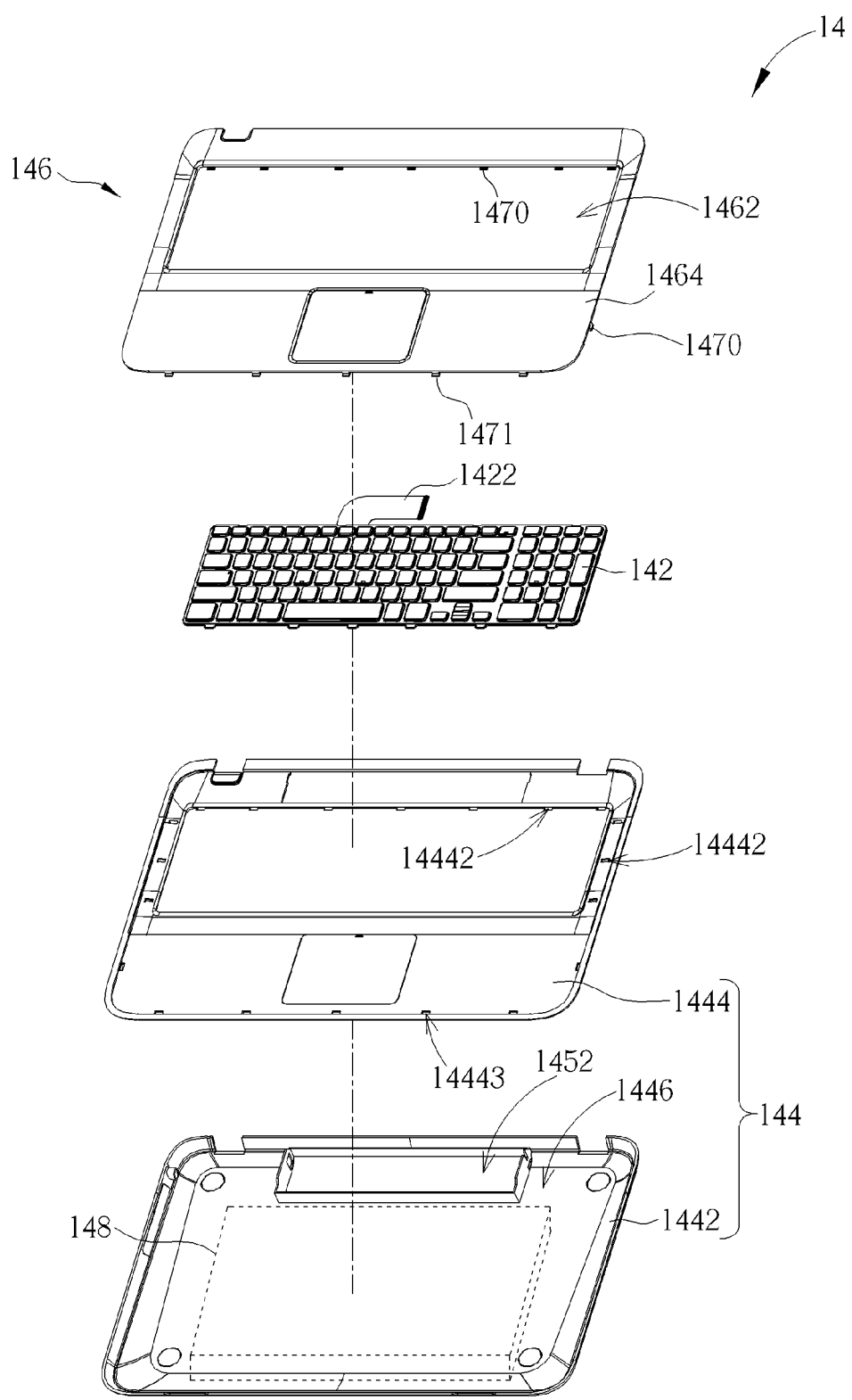
FIG. 2 is a partially-exploded view of the portable electronic apparatus in FIG. 1.
Figure 3:
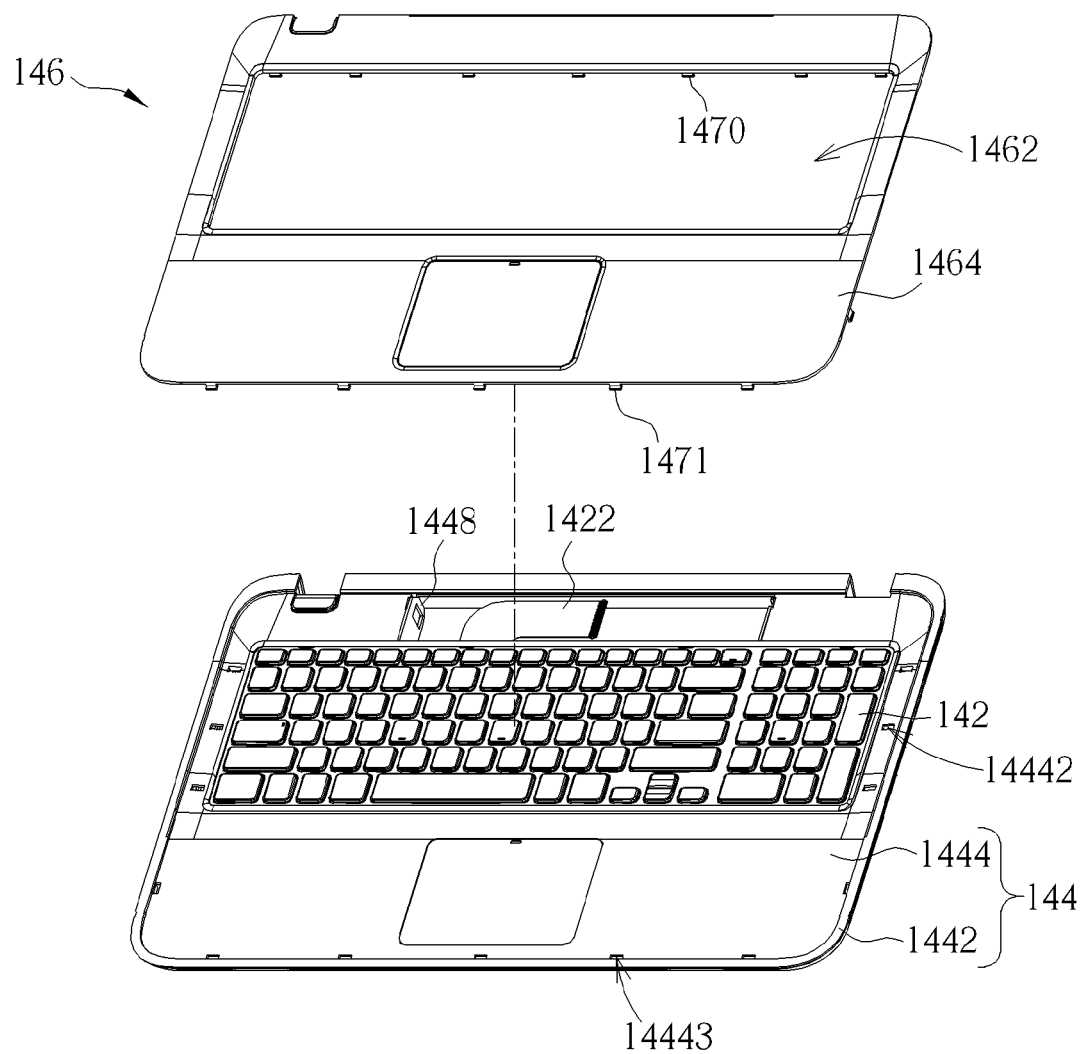
FIG. 3 is a schematic diagram illustrating the portable electronic apparatus in FIG. 2 after a bottom cover and a support cover thereof have been engaged.

Please refer to FIG. 1 and FIG. 2. FIG. 1 is a schematic diagram illustrating a portable electronic apparatus 1 of an embodiment according to the invention. FIG. 2 is a partially-exploded view of the portable electronic apparatus 1. In the embodiment, the portable electronic apparatus 1 is a notebook computer, but the invention is not limited to it. The portable electronic apparatus 1 includes a display 12 and a host 14. Therein, for simple illustration, only main casing members of the host 14 are shown in FIG. 2. The host 14 includes a first casing member, a second casing member, and a keyboard 142. In the embodiment, the first casing member is the base 144. The base 144 includes a bottom cover 1442 and a support cover 1444. The second casing member is the upper cover 146, regarded as the decoration cover for the base 144 in the embodiment; however, the invention is not limited to it. The bottom cover 1442 and the support cover 1444 are engaged to form an accommodating space 1446 for accommodating an electronic processing module 148 (shown by dashed lines in FIG. 2) of the host 14. FIG. 3 shows that the bottom cover 1442 has been engaged with the support cover 1444. The keyboard 142 is disposed on the support cover 1444 and electrically connected to the electronic processing module 148 (not shown in FIG. 3) through a flexible PCB 1422. The upper cover 146 has a window 1462. The keyboard 142 is exposed through the window 1462 after the upper cover 146 has been engaged with the base 144.

Figure 4:
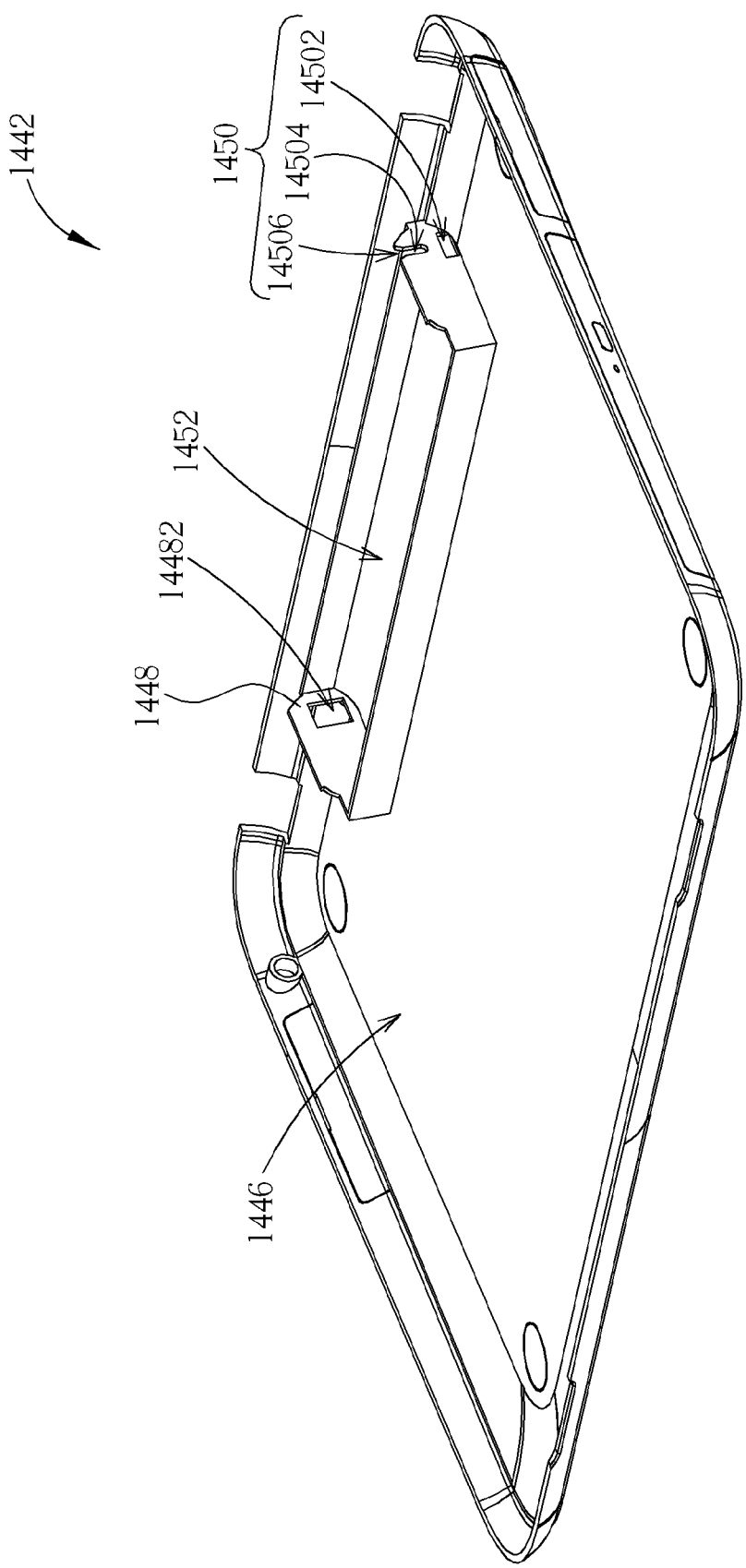
FIG. 4 is an enlarged view of the bottom cover in FIG. 2.

Please refer to FIG. 4, which is an enlarged view of the bottom cover 1442. The base 144 includes two engagement structures 1448 and 1450 on the bottom cover 1442. For simple illustration, the two engagement structures 1448 and 1450 are not necessarily identical. In practice, they can be identical, or one of them is applied. In the embodiment, the base 144 has a battery recess 1452; the engagement structures 1448 and 1450 form side walls of the battery recess 1452. The engagement structure 1448 has a lock slot 14482, a through hole. The engagement structure 1450 has a lock slot 14502 and a guiding slot 14504. The guiding slot 14504 has an opening 14506. Please refer to FIG. 2. The support cover 1444 has a plurality of lock slots 14442. The support cover 1444 and the bottom cover 1442 can be engaged together in a conventional technique, which is not described in detail. After the support cover 1444 has been engaged with the bottom cover 1442, the engagement structure 1448 and 1450 and the lock slots 14442 form the engagement interface to the upper cover 146.

Figure 5:
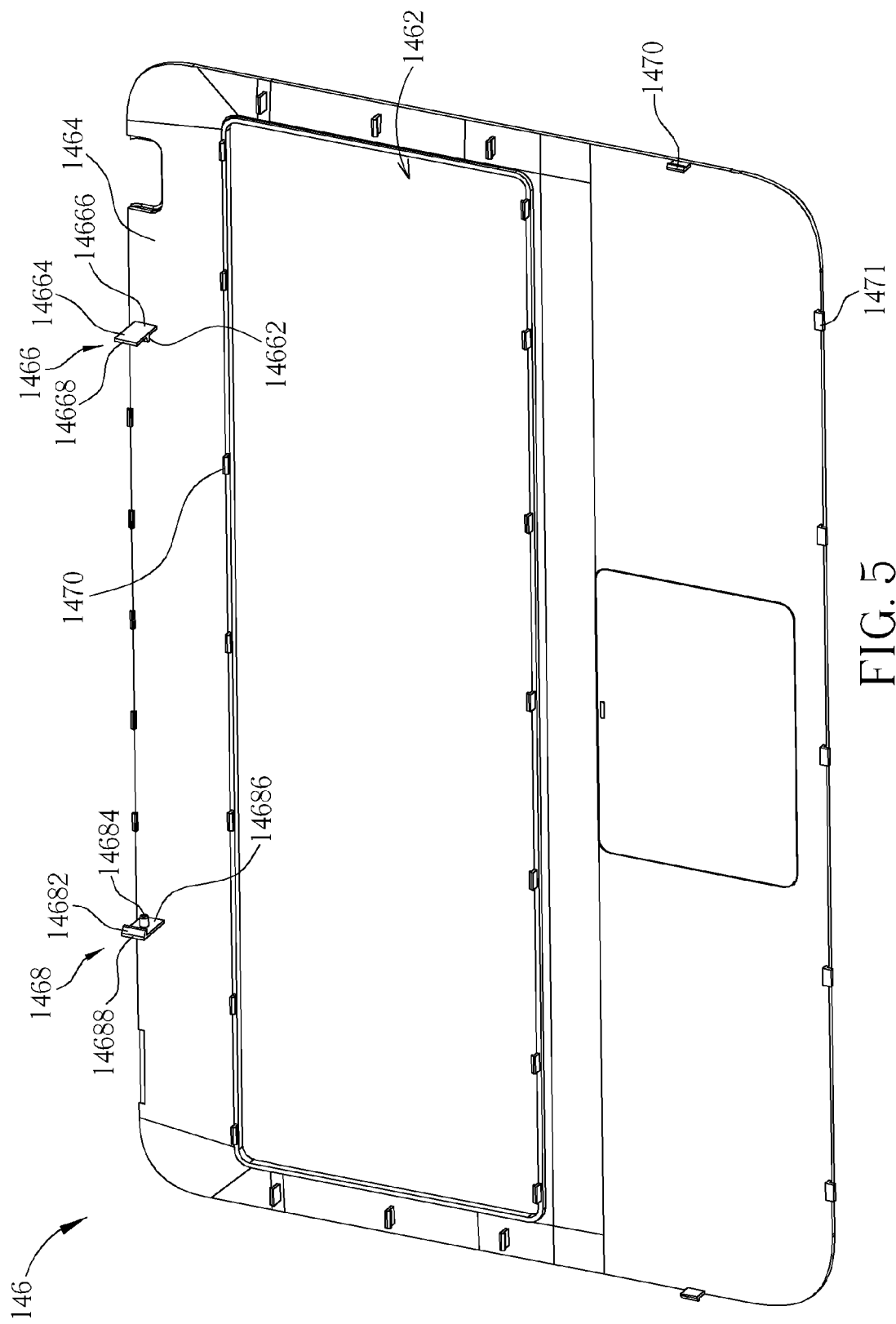
FIG. 5 is an enlarged view of an upper cover in FIG. 2 in another viewpoint.

Please refer to FIG. 5, which is an enlarged view of the upper cover 146 and shows another side of the upper cover 146 in FIG. 2. The upper cover 146 includes a plate member 1464, two engagement structures 1466 and 1468, and a plurality of hooks 1470. The engagement structures 1466 and 1468 correspond to the engagement structures 1448 and 1450 of the bottom cover 1442 respectively; the hooks 1470 correspond to the lock slots 14442. The engagement structures 1466 and 1468 and the hooks 1470 are fixed on the plate member 1464. The engagement structure 1466 includes a locking part 14662 and a detaching part 14664 connected to the locking part 14662. The engagement structure 1466 is presented as a cantilever structure, which has a fixed end 14666 and a free end 14668 and is fixed on the plate member 1464 by the fixed end 14666. The detaching part 14664 is plate-shaped and formed at the free end 14668. The locking part 14662 is a hook formed between the detaching part 14664 and the fixed end 14666. Similarly, the engagement structure 1468 includes a locking part 14682 and a detaching part 14684 connected to the locking part 14682. The engagement structure 1468 is presented as a cantilever structure, which has a fixed end 14686 and a free end 14688 and is fixed on the plate member 1464 by the fixed end 14686. The locking part 14682 is a hook formed at the free end 14688. The detaching part 14684 is a pillar between the fixed end 14686 and the locking part 14682. Thereby, during the engagement of the upper cover 146 with the base 144, the engagement structures 1466 and 1468 of the upper cover 146 are engaged with the engagement structures 1448 and 1450 of the bottom cover 1442 respectively such that the locking parts 14662 and 14682 are locked in the lock slots 14482 and 14502 and the hooks 1470 of the upper cover 146 are locked in the lock slots 14442 of the bottom cover 1442 respectively. It is added that, in practice, the engagement structures 1466 and 1468 and the hooks 1470 can be formed together with the plate member 1464 by injection molding; however, the invention is not limited to it. For example, it is acceptable to perform the forming by insertion molding.

Figure 6:
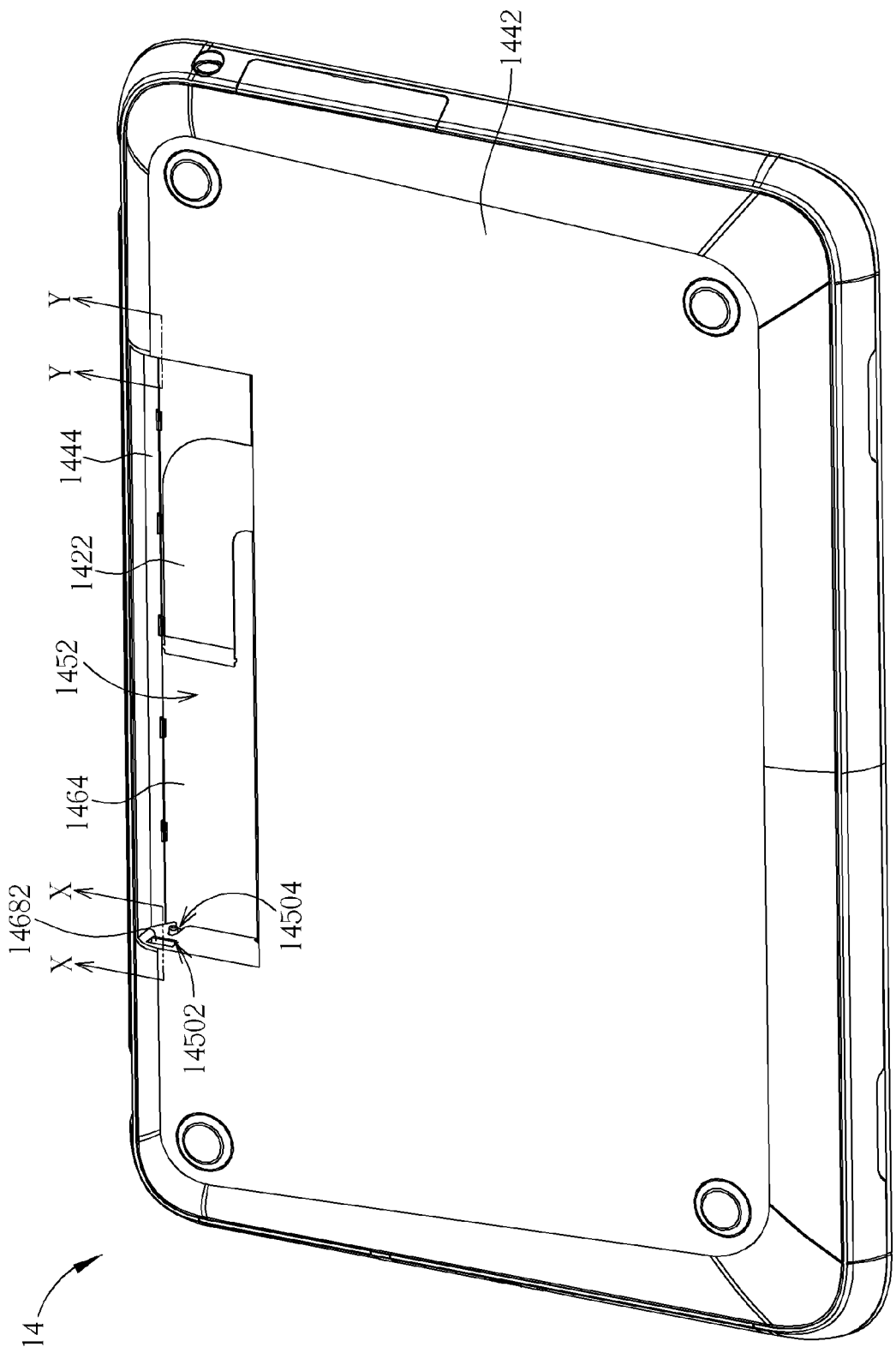
FIG. 6 is a schematic diagram illustrating the host in FIG. 1 in another viewpoint.

Please refer to FIG. 6, which is a schematic diagram illustrating the assembled host 14 and shows another side of the host 14 in FIG. 1. A part of the upper cover 146 (i.e. a part of the plate member 1464) and the detaching part 14684 are exposed in the battery recess 1452. The detaching part 14664 is also exposed in the battery recess 1452, which is not shown in FIG. 6 because of the view of the figure; it is unnecessary to be described herein. Thereby, a user can use his fingers to extend into the battery recess 1452 to move the detaching parts 14664 and 14684 so that the locking parts 14662 and 14682 depart from the lock slots 14482 and 14502. The description of the engagement and disengagement between the engagement structures 1466, 1468, 1448 and 1450 will be illustrated in the following.

Figure 7:
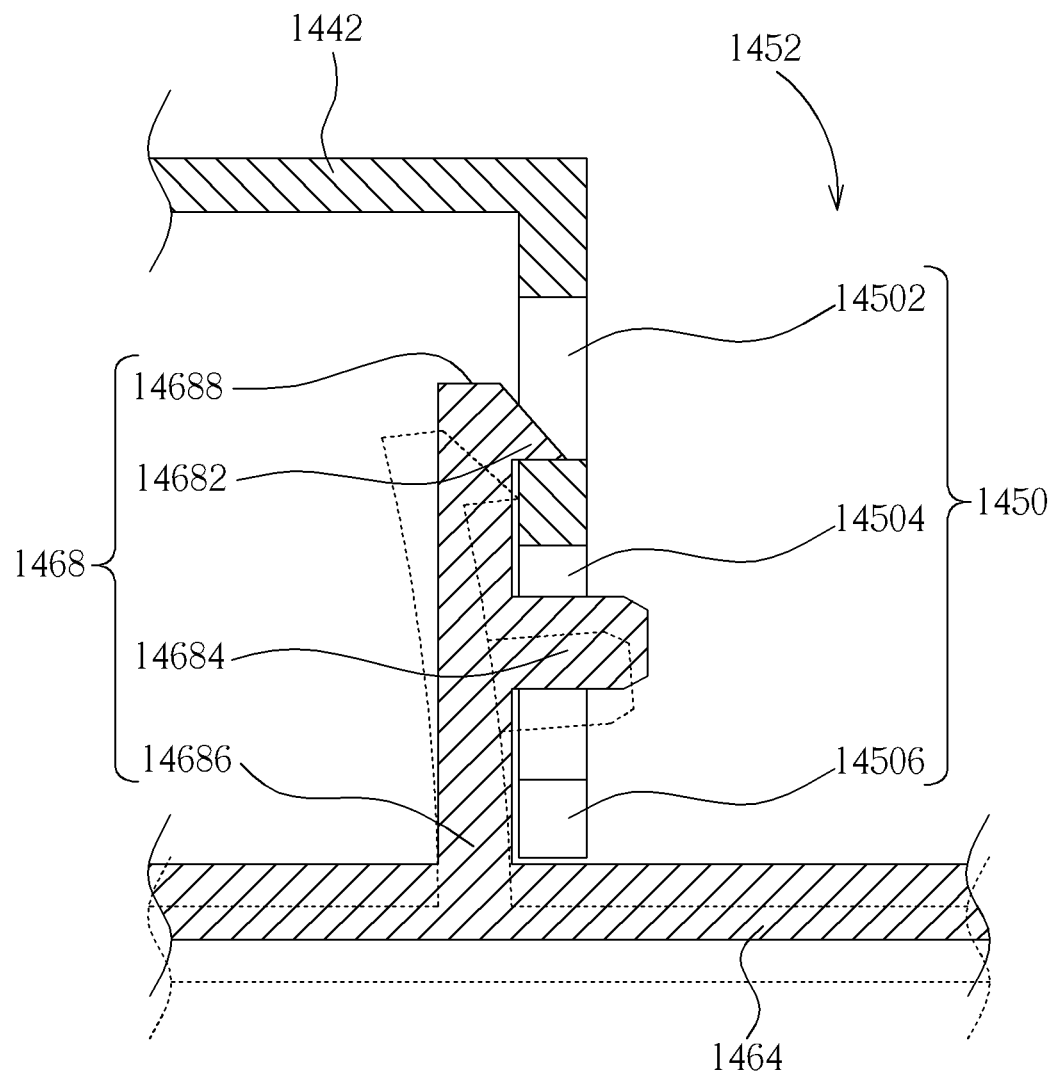
FIG. 7 is a sectional view of the engagement between an engagement structure of the upper cover and an engagement structure of the base in FIG. 6.

Please refer to FIG. 7, which is a sectional view of the engagement between the engagement structure 1468 of the upper cover 146 and the engagement structure 1450 of the base 144, of which the cutting plane is shown as the line X-X in FIG. 6. During the engagement of the upper cover 146 moving upwards from the lower of the figure to be engaged with the base 144, the engagement structure 1468 is pushed aslant by the engagement structure 1450, as shown by dashed lines in FIG. 7; then, the detaching part 14684 is guided into the guiding slot 14504 from the opening 14506, which also guides the locking part 14682 exactly into the lock slot 14502. The completed engagement is shown by solid lines in FIG. 7.

Figure 8:
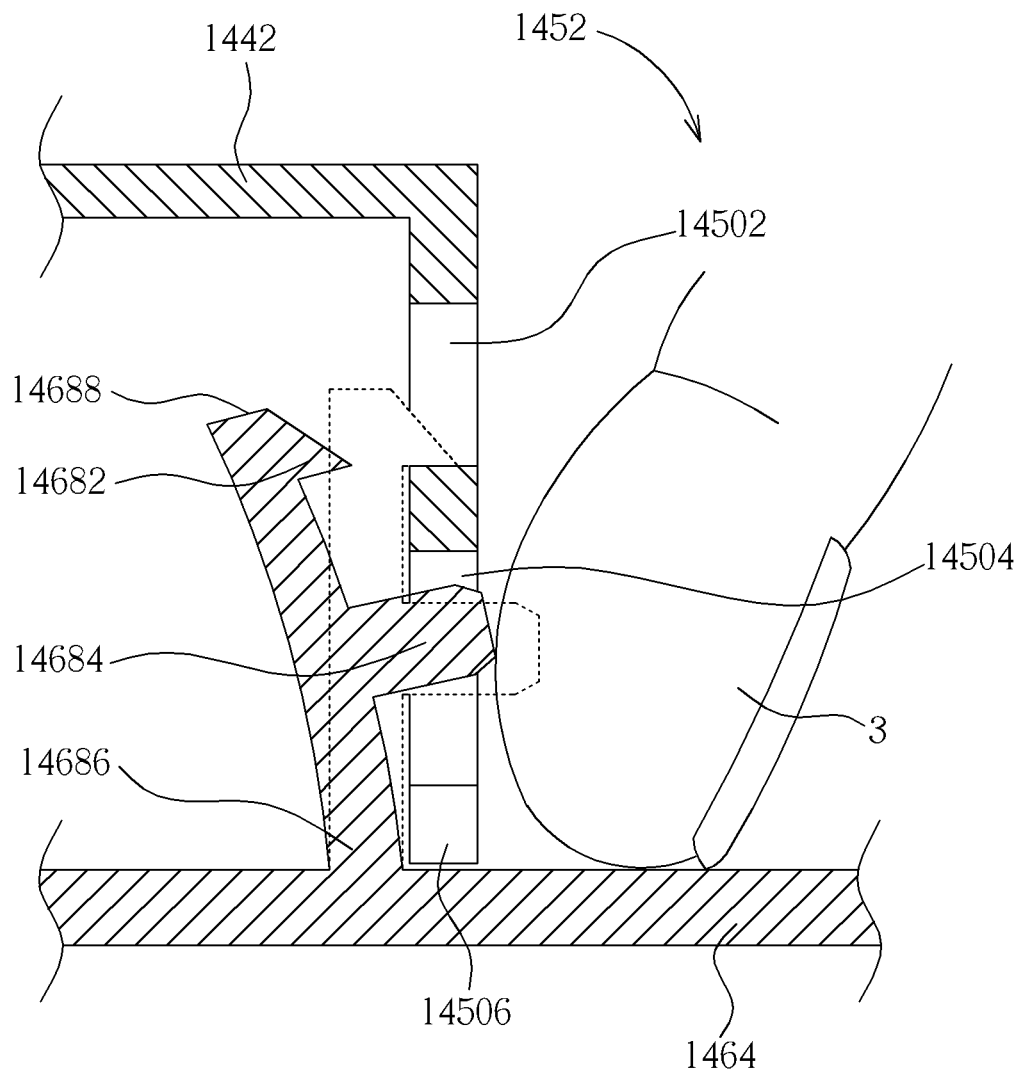
FIG. 8 is a sectional view of the disengagement between the engagement structure of the upper cover and the engagement structure of the base in FIG. 7.

Please refer to FIG. 8, which is a sectional view of the disengagement between the engagement structure 1468 of the upper cover 146 and the engagement structure 1450 of the base 144 in FIG. 7. When a user wants to detach the upper cover 146, the user can use his finger 3 to push the detaching part 14684 such that the engagement structure 1468 is slanted to make the locking part 14682 depart from the lock slot 14502. Then, the user can further use his finger 3 (or other object) to push the plate member 1464 such that the upper cover 146 can move downward so as to depart from the base 144. Thereby, the user can free-hand disengage the engagement between the engagement structure 1468 of the upper cover 146 and the engagement structure 1450 of the base 144, further to make the whole upper cover 146 depart away from the base 144. It is added that, in practice, the engagement strength of the hook 1470 and the lock slot 14442 is usually designed to be less to be easily pull off. In the embodiment, besides the stronger engagement strength provided by the engagement structures 1468 and 1450, the upper cover 146 also includes L-shaped hooks 1471 on the plate member 1464 opposite to the engagement structure 1468 to be inserted in corresponding lock slots 14443 formed on the support cover 1444 in a rotation way so as to also provide stronger engagement strength. Therefore, the whole engagement strength of the upper cover 146 and the base 144 can be kept sufficient.

Figure 9:
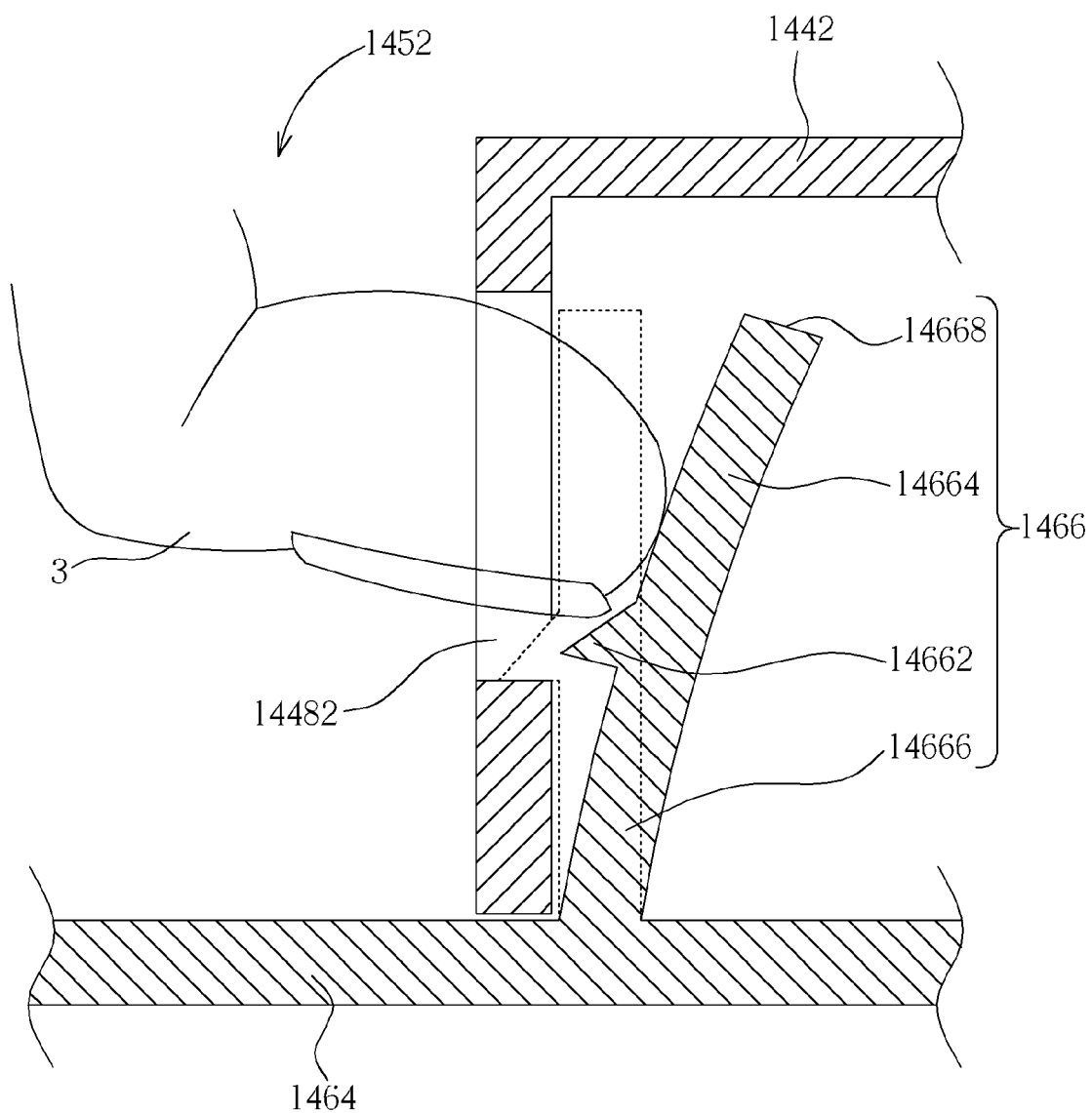
FIG. 9 is a sectional view of the disengagement between another engagement structure of the upper cover and another engagement structure of the base in FIG. 6.

The main difference between the abovementioned engagement mechanism and the engagement mechanism of engaging the engagement structure 1466 of the upper cover 146 with the engagement structure 1448 of the base 144 is that the engagement structure 1466 does not have the protrusive detaching part 14684 and the engagement structure 1448 does not have the guiding slot 14504, so the engagement between the engagement structures 1466 and 1448 still can be realized by referring to the above description, which is no longer described additionally. Please refer to FIG. 9, which is a sectional view of the disengagement between the engagement structure 1466 of the upper cover 146 and the engagement structure 1448 of the base 144 in FIG. 6, of which the cutting plane is shown as the line Y-Y in FIG. 6. When the user wants to detach the upper cover 146, the user can use his finger 3 (or other object) to pass through the lock slot 14482 to push the detaching part 14664 such that the engagement structure 1466 is slanted to make the locking part 14662 depart from the lock slot 14282. Then, the user can further use his finger 3 to push the plate member 1464 such that the upper cover 146 can move downward so as to depart from the base 144. For other descriptions, please refer to the relational description mentioned above of the disengagement of the engagement structures 1468 and 1450, which is no longer described herein.

Figure 10:
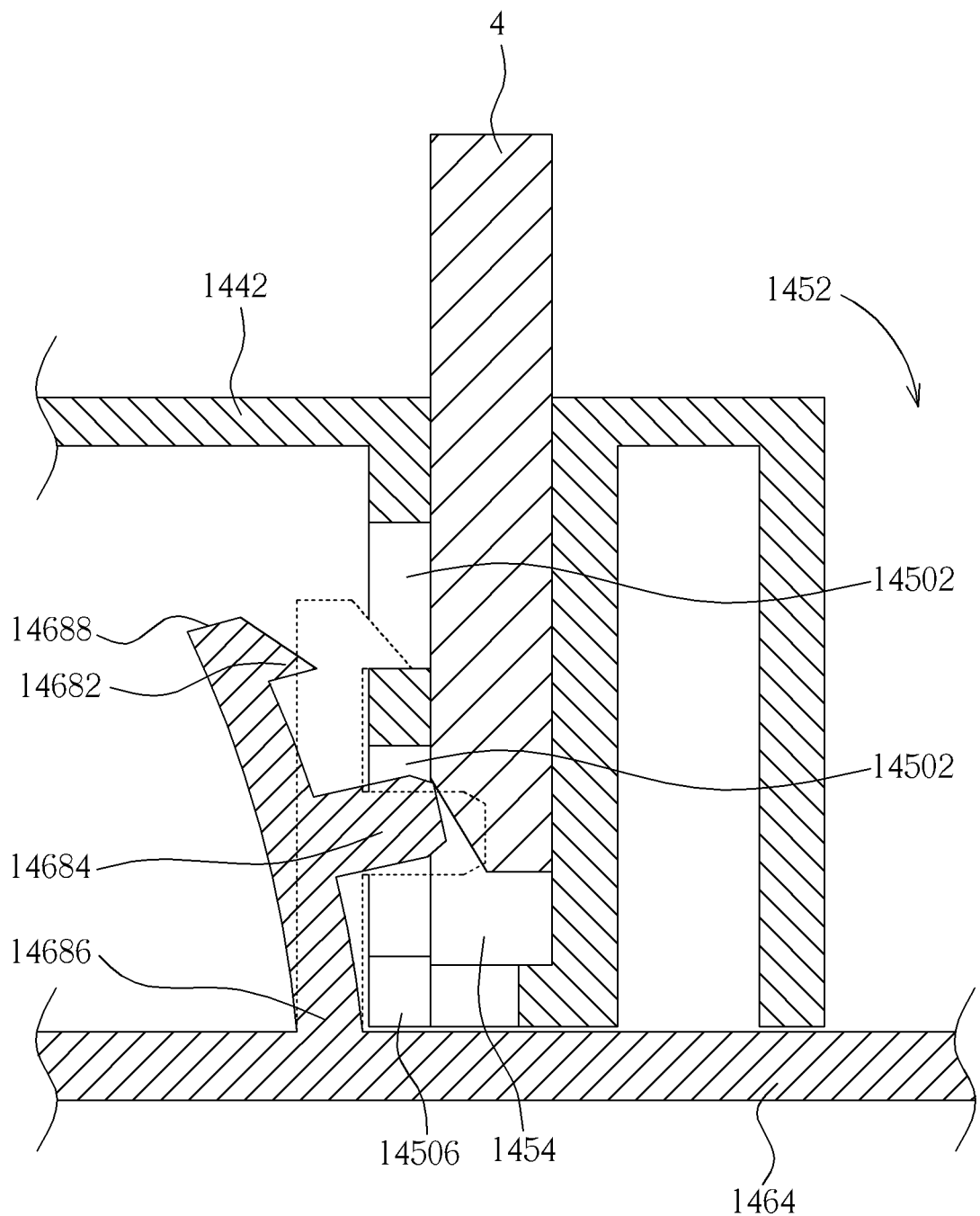
FIG. 10 is a sectional view of the disengagement between the engagement structure of the upper cover and the engagement structure of the base of another embodiment according to the invention.

In the above embodiment, the battery recess 1452 is also taken as the space for operation by the user; however, the invention is not limited to it. Pleaser refer to FIG. 10, which is a sectional view of the disengagement between the engagement structure 1468 of the upper cover 146 and the engagement structure 1450 of the base 144 of another embodiment according to the invention. In the embodiment, the base 144 has another recess 1454 close to the battery recess 1452, but the invention is not limited to it. The guiding slot 14504 is disposed at a side of the recess 1454. The detaching part 14684 is exposed in the recess 1454. The user can use an insertion plate 4 (or other object) to be inserted in the recess 1454 to move the detaching part 14684 such that the locking part 14682 departs from the lock slot 14502. If the recess 1454 is large enough for accommodating a finger, the user can use his finger to move the detaching part 14684. For other descriptions, please refer to the relational description mentioned above of the disengagement between the engagement structures 1468 and 1450, which is no longer described herein.

Figure 11:
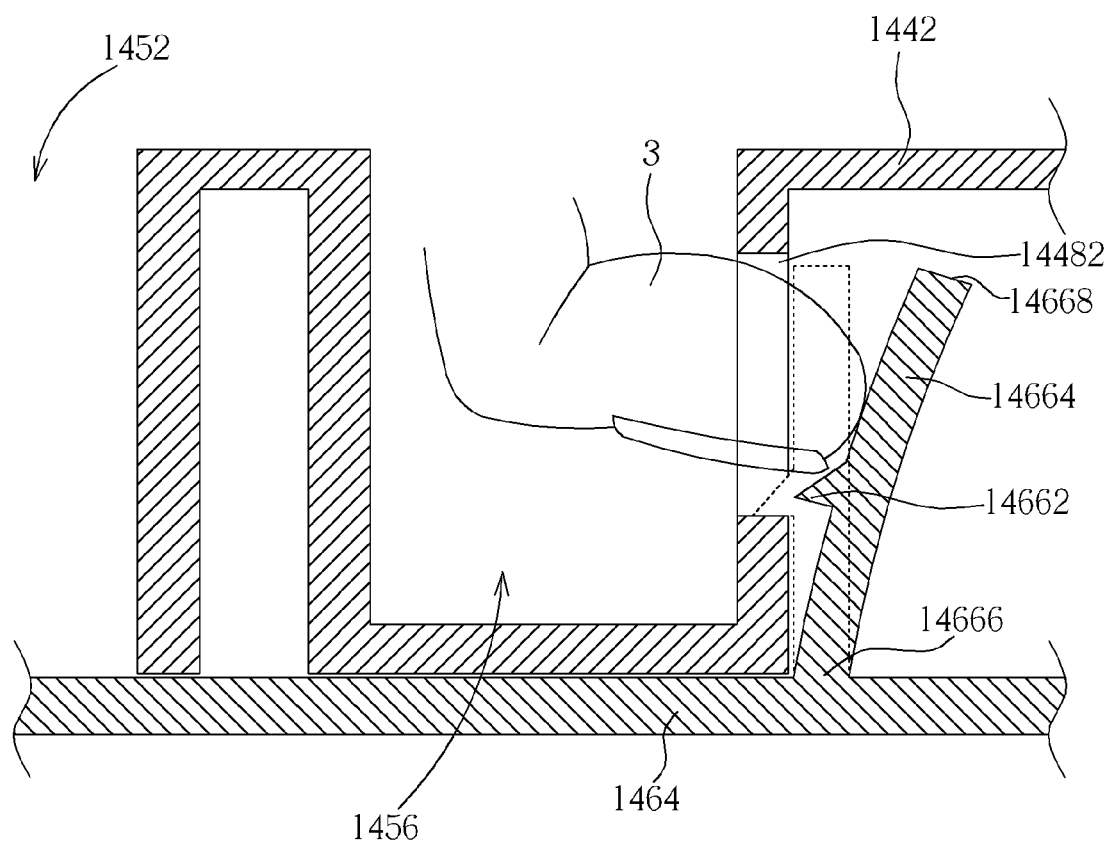
FIG. 11 is a sectional view of the disengagement between said another engagement structure of the upper cover and said another engagement structure of the base of another embodiment according to the invention.

Please refer to FIG. 11, which is a sectional view of the disengagement between the engagement structure 1466 of the upper cover 146 and the engagement structure 1448 of the base 144 of another embodiment according to the invention. In the embodiment, similarly, the base 144 has another recess 1456 close to the battery recess 1452; however, the invention is not limited to it. The lock slot 14482 is connected to the recess 1456. Therefore, the user can use his finger 3 (if the recess 1456 is large enough) or other object to be inserted in the recess 1456 to pass through the lock slot 14482 to push the detaching part 14664 such that the locking part 14662 departs from the lock slot 14482. For other descriptions, please refer to the relational description mentioned above of the disengagement of the engagement structures 1466 and 1448, which is no longer described herein.

As discussed above, the invention uses the detaching part connected to the locking part of the portable electronic apparatus and the casing thereof so that a user can directly manipulate the detaching part without any tools to make the locking part depart. Further, by the design of the engagement of the other engagement structure, such as with lower engagement strength, of the upper cover with the base, the upper cover can be detached completely by free hands, which is more easier for the user to detach the upper cover. Therefore, the invention satisfies both the fixity of the casing engagement and the convenience of the casing detachment, which solves the complicated detachment procedure and the difficulty in satisfying both the convenience and the fixity of the engagement for the casing in the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A casing for portable electronic apparatus, comprising:
   a first casing member, comprising a first engagement structure having a lock slot, the first engagement structure comprises a guiding slot having an opening; and
   a second casing member, comprising a plate member and a second engagement structure, the second engagement structure being fixed on the plate member and comprising a locking part and a detaching part connected to the locking part, the second casing member being engaged with the first casing member such that the locking part is locked in the lock slot of the first engagement structure;
   wherein the detaching part is a pillar, the pillar is guided into the guiding slot from the opening during engagement of the second casing member with the first casing member, and the detaching part is capable of being moved so as to detach the locking part from the lock slot of the first engagement structure.

2. The casing of claim 1, wherein the second engagement structure is presented as a cantilever structure having a fixed end and a free end, the cantilever structure is fixed on the plate member by the fixed end, the locking part is a hook formed at the free end, and the detaching part is disposed between the fixed end and the hook.

3. The casing of claim 2, wherein the first casing member has a recess, the guiding slot is disposed at a side of the recess, the pillar is exposed in the recess, and an object is capable of being inserted into the recess to move the pillar so as to detach the locking part from the lock slot.

4. The casing of claim 2, wherein the first casing member has a battery recess, and a part of the second casing member and the detaching part are exposed in the battery recess.

5. The casing of claim 2, wherein the first casing member comprises a bottom cover and a support cover engaged with the bottom cover, the first engagement structure is disposed on the bottom cover, and the second casing member comprises a plurality of hooks fixed on the plate member and correspondingly locked in lock slots of the support cover.

6. A portable electronic apparatus, comprising:
   a base, comprising a first engagement structure having a lock slot, the first engagement structure comprises a guiding slot having an opening;
   an electronic processing module, disposed in the base; and
   an upper cover, comprising a plate member and a second engagement structure, the second engagement structure being fixed on the plate member and comprising a locking part and a detaching part connected to the locking part, the upper cover being engaged with the base such that the locking part is locked in the lock slot of the first engagement structure;
   wherein the detaching part is a pillar, the pillar is guided into the guiding slot from the opening during engagement of the upper cover with the base, and the detaching part is capable of being moved so as to detach the locking part from the lock slot of the first engagement structure.

7. The portable electronic apparatus of claim 6, wherein the second engagement structure is presented as a cantilever structure having a fixed end and a free end, the cantilever structure is fixed on the plate member by the fixed end, the locking part is a hook formed at the free end, and the detaching part is disposed between the fixed end and the hook.

8. The portable electronic apparatus of claim 7, wherein the base has a recess, the guiding slot is disposed at a side of the recess, the pillar is exposed in the recess, and an object is capable of being inserted into the recess to move the pillar so as to detach the locking part from the lock slot.

9. The portable electronic apparatus of claim 7, wherein the base comprises a bottom cover and a support cover engaged with the bottom cover to form an accommodating space where the electronic processing module is disposed, the first engagement structure is disposed on the bottom cover, and the upper cover comprises a plurality of hooks fixed on the plate member and correspondingly locked in lock slots of the support cover.

10. The portable electronic apparatus of claim 9, further comprising a keyboard electrically connected to the electronic processing module and disposed on the support cover to be exposed through a window of the upper cover.

* * * * *